US009373502B2

(12) United States Patent
Bao et al.

(10) Patent No.: US 9,373,502 B2
(45) Date of Patent: Jun. 21, 2016

(54) STRUCTURE FOR III-V DEVICES ON SILICON

(71) Applicant: Applied Materials, Inc., Santa Clara, CA (US)

(72) Inventors: Xinyu Bao, Fremont, CA (US); Errol Antonio C. Sanchez, Tracy, CA (US)

(73) Assignee: Applied Materials, Inc., Santa Clara, CA (US)

( * ) Notice: Subject to any disclaimer, the term of this patent is extended or adjusted under 35 U.S.C. 154(b) by 63 days.

(21) Appl. No.: 14/287,927

(22) Filed: May 27, 2014

(65) Prior Publication Data

US 2014/0357057 A1 Dec. 4, 2014

Related U.S. Application Data

(60) Provisional application No. 61/830,856, filed on Jun. 4, 2013.

(51) Int. Cl.
*H01L 21/02* (2006.01)
*H01L 29/778* (2006.01)
*H01L 29/15* (2006.01)

(52) U.S. Cl.
CPC ...... *H01L 21/02463* (2013.01); *H01L 21/0262* (2013.01); *H01L 21/02381* (2013.01); *H01L 21/02502* (2013.01); *H01L 21/02546* (2013.01); *H01L 29/15* (2013.01); *H01L 29/7783* (2013.01)

(58) Field of Classification Search
CPC .............. H01L 21/02365; H01L 21/02387; H01L 21/02436; H01L 21/02518; H01L 29/1025; H01L 29/107
See application file for complete search history.

(56) References Cited

U.S. PATENT DOCUMENTS

2008/0157058 A1* 7/2008 Hudait ............. H01L 21/02381
257/14

OTHER PUBLICATIONS

Bolkhovityanov, Y.B., et al., "III-V Compounds-on-Si: Heterostructure Fabrication, Application and Prospects," The Open Nanoscience Journal, Oct. 2009, vol. 3, Issue 1, pp. 20-33.
Li, J.Z., et al., "Defect reduction of GaAs epitaxy on Si (001) using selective aspect ratio trapping," Applied Physics Letters, vol. 91(2), Jul. 9, 2007, 3 pages.
Park, J-S, et al., "Defect reduction of selective Ge epitaxy in trenches on Si(001) substrates using aspect ratio trapping," Applied Physics Letters, Jan. 2007, vol. 90, Issue 5, 3 pages.
Pribat, D., et al., "Defect-free, conformally grown (100) GaAs films," 1990 American Institute of Physics, Applied Physics Letters vol. 57, Issue 4, Jul. 23, 1990, pp. 375-377.
Pribat, D., et al., "High quality GaAs on Si by conformal growth," 1992 American Institute of Physics, Applied Physics Letters vol. 60, Issue 17, Apr. 27, 1992, pp. 2144-2146.

(Continued)

*Primary Examiner* — Cheung Lee
(74) *Attorney, Agent, or Firm* — Patterson & Sheridan, LLP

(57) ABSTRACT

Embodiments described herein relate to a structure for III-V devices on silicon. A Group IV substrate is provided and a III-V structure may be formed thereon. The III-V structure generally comprises one or more buffer layers and a channel layer disposed on the one or more buffer layers. The one or more buffer layers may be selected to provide optimal microelectronic device properties, such as minimal defects, reduced charge accumulation, and reduced current leakage.

19 Claims, 3 Drawing Sheets

(56) References Cited

OTHER PUBLICATIONS

Radosavljevic, M., "Electrostatics Improvement in 3-D Tri-gate Over Ultra-Thin Body Planar InGaAs Quantum Well Field Effect Transistors with High-K Gate Dielectric and Scaled Gate-to-Drain/Gate-to-Source Separation," Electron Devices Meeting (IEDM), 2011 IEEE International, 2011, pp. 33.1.1-33.1.4.

Wang, G., et al., "Selective Area Growth of InP in Shallow-Trench-Isolated Structures on Off-Axis Si(001) Substrates," Journal of the Electrochemical Society, Sep. 2010, vol. 157, Issue 11, pp. H1023-H1028.

Wu, et al., "First Experimental Demonstration of 100 nm Inversion-mode InGaAs FinFET through Damange-free Sidewall Etching," Electron Devices Meeting (IEDM), 2009, IEEE International, Dec. 7-9, 2009, pp. 13.4.1-13.4.4.

Zhou, X., et al., "30 nm Enhancement In0.53Ga0.47As MOSFETS on Si Substrates Grown by MOCVD Exhibiting High Transcondunctance and Low On-resistance," Department of Electronic & computer Engineering, Hong Kong University of Science and Technology, 2012 IEEE, pp. 32.5.1-32.5.4.

Mukherjee, N., et al., "MOVPE III-V Material Growth on Silicon Substrates and its Comparison to MBE for Future High Performance and Low Power Login Applications (Invited Paper)," Intel Corporation, Technology and Manufacturing Group, 2011 IEEE, pp. 35.1.1-35.1.4.

Shinohara, M., "Dislocation-free GaAs Epitaxial Growth with the Use of Modulation-Doped AlAs-GaAs Superlattice Buffer Layers," Applied Physics Letters, vol. 52, Issue 7, Feb. 15, 1988, pp. 543-545.

\* cited by examiner

STRUCTURE FOR III-V DEVICES ON SILICON

CROSS-REFERENCE TO RELATED APPLICATIONS

This application claims benefit of U.S. Provisional Patent Application Ser. No. 61/830,856, filed Jun. 4, 2013, wherein is herein incorporated by reference. This application is also related to U.S. Provisional Patent Application Ser. No. 61/822,541, filed May 13, 2013.

FIELD

Embodiments described herein generally relate to heteroepitaxial growth of materials that have high lattice mismatch to silicon (Si) for microelectronic applications. More specifically, embodiments described herein relate to a structure for Group III-V (III-V) devices on Si.

BACKGROUND

III-V elements may be advantageous in certain applications for silicon-based devices, for example, channel materials due to high electron mobility and source/drain materials due to low contact resistance and the ability to function as a stressor for mobility enhancement in silicon-based devices. As such, research has been undertaken concerning the deposition of III-V materials on III-V substrates. However, given the expense of III-V substrates, these applications are often associated with lacking cost effectiveness. Defects during heteroepitaxy of III-V elements on silicon arise from material incompatibilities such as large lattice mismatch (>4%), valency difference, thermal property differences, and conductivity differences. The defects may include dislocations, anti-phase boundaries, and stacking faults for III-V layers. III-V features are frequently formed in trenches or blanketed on substrates. Although beneficial with smaller device size requirements, III-V element growth inside high aspect ratio (depth vs. opening width) trenches becomes increasingly difficult.

III-V element channels are generally formed in an array of nanometer scale planar or vertical structures with critical dimensions of about 5-15 nm and depths of about 20-100 nm. High quality III-V element channels have minimal defects ($<10^5/cm^2$), consistent and controlled composition and morphology, and no parallel conduction of carriers other than in the active device region of the channel structures. Minimal current leakage and charge accumulation within the channels are desired to improve performance of the microelectronic device. Current buffer structures using GaAs/InP or GaAs/InAlAs are generally too thick (>1 μm) to be cost effective and do not provide adequate current leakage control. Given the inherent difficulties associated with forming III-V layers on silicon, achieving high quality III-V element channels presents a substantial challenge.

Thus, what is needed in the art is a structure for III-V materials on silicon that provides desirable characteristics and improved performance over current III-V structures.

SUMMARY

In one embodiment, a method of forming a device structure on a substrate is provided. The method includes depositing a first III-V buffer layer on a Group IV substrate. An AlAs buffer layer may be deposited over the first III-V buffer layer and a III-V device layer may be deposited over the AlAs buffer layer.

In another embodiment, a method of forming a device structure on a substrate is provided. The method includes depositing a first III-V buffer layer on a Group IV substrate, wherein the first III-V buffer layer comprises a superlattice structure. An AlAs buffer layer may be deposited over the first III-V buffer layer and a III-V device layer may be deposited over the AlAs buffer layer.

In yet another embodiment, a method of forming a device structure on a substrate is provided. The method includes depositing a first III-V buffer layer comprising GaAs having a thickness of between about 10 nm and about 20 nm on a Group IV substrate. An AlAs buffer layer having a thickness between about 50 nm and about 800 nm may be deposited over the first III-V buffer layer. A III-V device layer comprising InAs or InGaAs having a thickness between about 5 nm and about 15 nm may be deposited over the AlAs buffer layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments described herein relate to a structure for III-V devices on silicon. A Group IV substrate is provided and a III-V structure may be formed thereon. The III-V structure generally comprises one or more buffer layers and a channel layer disposed on the one or more buffer layers. The one or more buffer layers may be selected to provide optimal microelectronic device properties, such as minimal defects, reduced charge accumulation, and reduced current leakage.

Figure 1:
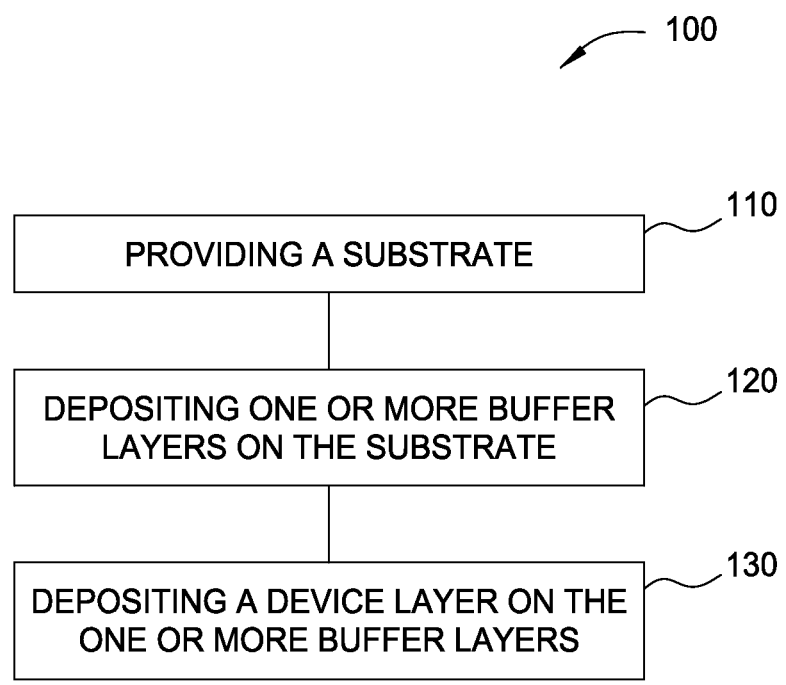
FIG. 1 depicts a method of forming a device structure comprising III-V elements on a substrate according to certain embodiments described herein.
Figure 2A:
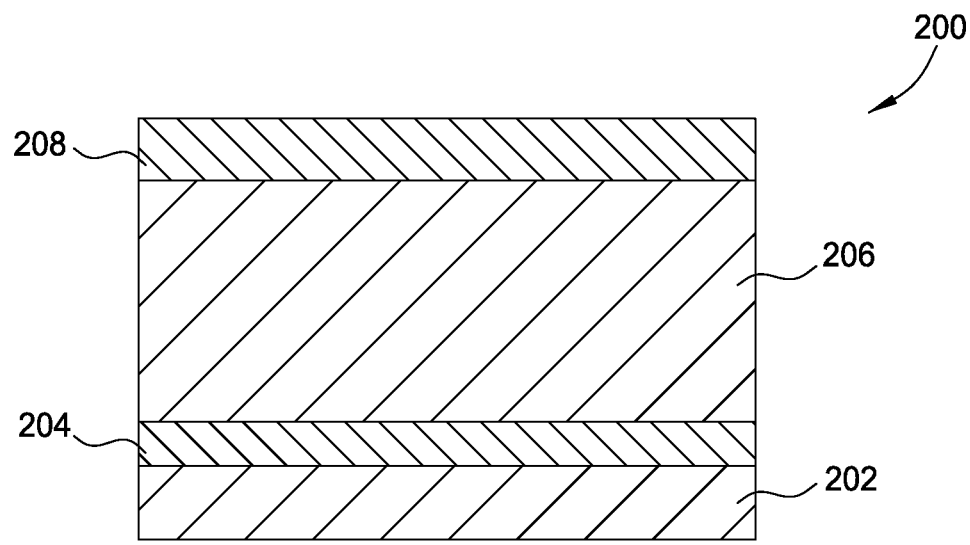
FIG. 2A depicts a structure formed according to the method of FIG. 1 according to certain embodiments described herein.
Figure 2B:
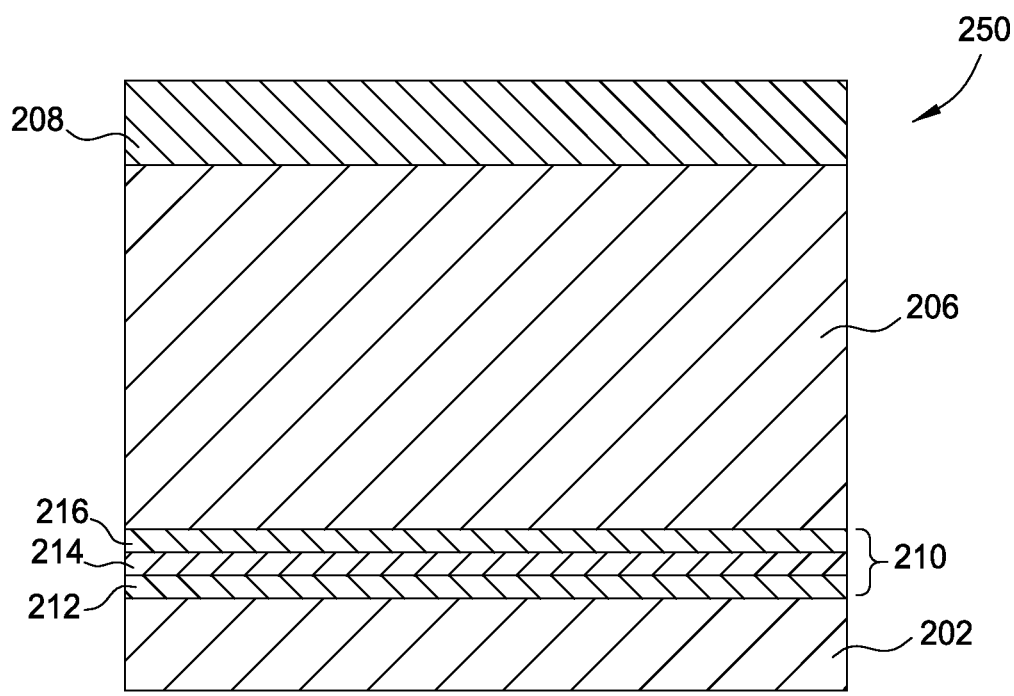
FIG. 2B depicts a structure formed according to the method of FIG. 1 according to certain embodiments described herein.

FIG. 1 depicts a method 100 of forming a device structure comprising III-V elements on a substrate according to certain embodiments described herein. The method 100 is described below in accordance with III-V structures 200/250 as illustrated in FIGS. 2A-2B. In general, the method 100 may be used to form III-V device structures 200/250 on blanket (MOSFETS) or patterned (FinFETs) substrates by various deposition processes, such as metal organic chemical vapor deposition (MOCVD), molecular beam epitaxy (MBE), hydride vapor phase epitaxy (HVPE), physical vapor deposition (PVD), and the like.

FIG. 2A depicts a structure formed according to the method of FIG. 1 according to certain embodiments described herein. The method at operation 110 provides a substrate 202. The substrate 202 may comprise a Group IV material, such as silicon (Si), silicon-germanium (SiGe), germanium (Ge), germanium-tin (GeSn), silicon-germanium-tin (SiGeSn), and the like. In one embodiment, the substrate 202 comprises Si. In certain embodiments, a surface of the substrate 202 may have a <001> oriented surface or a <111> oriented surface. The orientation of the substrate 202 surface may help control defect relaxation or termination as the structure 200 is grown on the substrate 202. In certain embodiments, the substrate 202 may also be a blanket substrate. The substrate 202 may have pre-patterned features, such as trenches, holes, vias and the like. In these embodiments, Group IV materials may be exposed at designated areas and adjacent portions of the Group IV materials may be covered by dielectric materials, such as oxides and nitrides.

At operation 120, one or more buffer layers 204/206 may be deposited on the substrate 202. In one embodiment, a first buffer layer 204 may be deposited on the substrate 202 and a second buffer layer 206 may be deposited on the first buffer layer 204. The first buffer layer 204 may contact the substrate 202 and the second buffer layer 206 may contact the first buffer layer 204. In one embodiment, the first buffer layer 204 may be deposited to a thickness between about 5 nm and about 50 nm, such as between about 10 nm and about 20 nm. It is believed that the small thickness of the first buffer layer 204 may prevent relaxation of defects within the first buffer layer 204 which may ultimately produce a substantially defect free III-V structure with the addition of the second buffer layer 206. In certain embodiments, the first buffer layer 204 may be optional.

The first buffer layer 204 may comprise a III-V material, such as gallium arsenide (GaAs). GaAs, having a lattice constant of about 5.65 Å at 300 K, has a low lattice mismatch (approximately 4%) with Si, which has a lattice constant of about 5.43 Å at 300 K. The low lattice mismatch results in a reduction in defects within the III-V structure 200. In addition to the low lattice mismatch, the coefficient of thermal expansion of GaAs is similar to Si, which may also be important to reduce defects in the III-V structure due to temperature cycling in III-V material deposition processes. In another embodiment, the first buffer layer 204 may comprise aluminum arsenide (AlAs). In this embodiment, oxygen present at the Si surface may be eliminated to prevent oxidation of the AlAs layer. In certain embodiments, the AlAs buffer layer may be metamorphic.

Continuing at operation 120, the second buffer layer 206 may be deposited over the first buffer layer 204, for example, contacting the first buffer layer 204. The second buffer layer 206 may comprise aluminum arsenide (AlAs), which has a lattice constant of about 5.66 Å at 300 K. The second buffer layer 206 may be deposited having a thickness of between about 50 nm and about 800 nm, such as between about 200 nm and about 600 nm, such as about 500 nm. The thickness of the second buffer layer 206 may also allow defects created due to the lattice mismatch between Si and the first buffer layer 204 to relax within the second buffer layer 206. Allowing the defects to relax within the second buffer layer 206 allows the AlAs to assume its natural lattice size prior to deposition of subsequent layers. However, the thickness of the second buffer layer 206 may also be selected to maintain the AlAs material in a strained state so long as the quality of the AlAs material is acceptable.

The second buffer layer 206 may be selected with relation to the band gap the second buffer layer 206 material exhibits. It is desirable that the second buffer layer 206 have a larger band gap than the first buffer layer 204. In one embodiment, the second buffer layer 206 comprising AlAs has a larger band gap (2.15 eV) than the first buffer layer 204, GaAs (1.42 eV). Moreover, AlAs is an indirect band gap material. The band gap properties of AlAs allow AlAs to provide improved charge isolation and prevent leakage between adjacent gate structures when utilized in combination with a GaAs first buffer layer 204.

The method 100 at operation 130 deposits a device layer 208 on the one or more buffer layers 204/206. In certain embodiments, the device layer 208 may comprise one or more layers of III-V material. In one embodiment, the device layer 208 may comprise indium aluminum arsenide (InAlAs), indium gallium arsenide (InGaAs), or a combination thereof. The device layer 208 may have a thickness of between about 2 nm and about 20 nm, such as between about 5 nm and about 15 nm. In one embodiment, the device layer 208 comprises an InAlAs layer deposited over the second buffer layer 206 and an InGaAs layer deposited over the InAlAs layer. In another embodiment, the device layer 208 comprises an InGaAs ($In_xGa_{1-x}As$, x=0.5 to 1) layer deposited on the second buffer layer 206. In embodiments, using multiple layers of III-V material for the device layer 208, the layers may be selected to further eliminate defects present within the material and to improve charge isolation and prevent charge accumulation and leakage. After the device layer 208 has been deposited over the second buffer layer 206, the device layer 208 may be planarized, such as by chemical mechanical polishing or isotropic etching, prior to further processes being performed on the device structure 200.

FIG. 2B depicts a structure 250 formed according to the method 100 of FIG. 1 according to certain embodiments described herein. Identical features of the structure 250 described with regard to the structure 200 of FIG. 1A will not be further discussed for the sake of brevity. The substrate 202 is provided at operation 110. At operation 120, one or more buffer layers 210/206 are deposited on the substrate 202. In one embodiment, a superlattice buffer layer 210 comprises a superlattice structure. A superlattice structure may be defined as a structure having one or more layers of different material deposited in an alternating and repeating manner. Similar to the first buffer layer 204 in FIG. 2A, the superlattice buffer layer 210 may have a thickness between about 5 nm and about 50 nm, such as between about 10 nm and about 20 nm.

In one embodiment, the superlattice buffer layer 210 may have one or more superlattice layers 212/214/216. A first superlattice layer 212 deposited on the substrate 202 may comprise GaAs and be selected due to the low lattice mismatch between GaAs and Si. A second superlattice layer 214 deposited on the first superlattice layer 212 may comprise AlAs. In various other embodiments, the second superlattice layer 214 may comprise $In_xGa_{1-x}As$ (x<0.3), $Al_xGA_{1-x}As$ (x>0.5), $In_xAl_{1-x}As$ (x<0.7), or indium phosphide (InP). A third superlattice layer 216 may comprise the same material as the first superlattice layer 212 or another material different from the material used in the first superlattice layer 212 and the second superlattice layer 214. In one embodiment, the third superlattice layer 216 may comprise GaAs. The superlattice buffer layer 210 allows for a smoother transition between the substrate 202 crystal lattice structure and the second buffer layer 206 crystal lattice structure. The superlattice structure of the superlattice buffer layer 210 may also reduce defects present in the second buffer layer 206.

In embodiments where the second superlattice layer 214 comprises AlAs, charge isolation and leakage prevention may be further improved due to the larger, indirect band gap of AlAs as compared to GaAs. Still further, AlAs has a relatively smaller coefficient of thermal expansion than GaAs which may provide additional reduction in defects in the second buffer layer 206.

Figure 3:
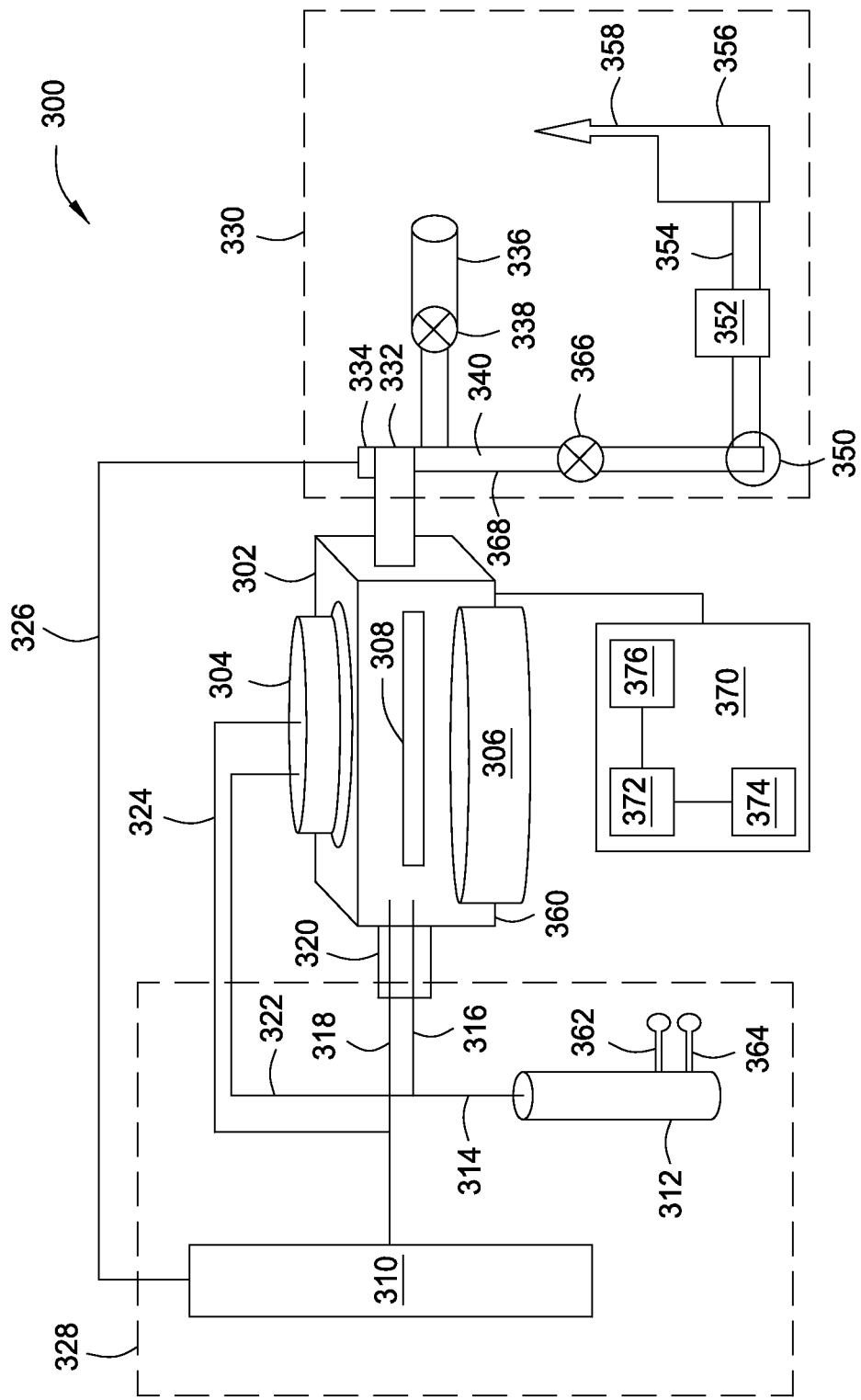
FIG. 3 depicts a schematic diagram of an apparatus for depositing a layer on a substrate according to certain embodiments described herein.

FIG. 3 depicts a schematic diagram of an apparatus 300 for depositing a layer on a substrate according to certain embodiments described herein. More specifically, the apparatus 300 may be used to deposit a Group III-V layer on a silicon substrate. The apparatus 300, such as the Centura® Epi™ 300 mm chamber or 300 mm xGen™ chamber, both available from Applied Materials, Inc., Santa Clara, Calif., may be adapted to make and use embodiments described herein. Other chambers available from Applied Materials, Inc. or other manufacturers may also be modified or used in accordance with the teachings provided herein.

In certain embodiments, a processing chamber 302 may have a substrate support 308, which may be a rotating substrate support, disposed therein. The substrate support 308 may also be a plate heated by embedded heating elements, or a ring or support pins. A heat source 306 may be disposed facing one side of the substrate support 308. In one embodiment, a heat source may be embedded in the substrate support 308 or, in another embodiment, a plurality of lamps (not shown) may be adapted to heat the chamber 302 and a substrate being processed therein. The processing chamber 302 may comprise a showerhead 304 for gas entry into the chamber 302. Alternatively, or in combination, gas may be provided to the processing chamber 302 via a side entry 320 coupled to a side wall 360 of the chamber 302.

A feed system 328, which may include a gas delivery system 310 and a liquid or solid precursor contact chamber 312, may be coupled to the chamber 302 through a plurality of conduits. A first conduit 322 and a second conduit 324 may couple the feed system 328 to the optional showerhead 304. The showerhead 304 may be a dual-pathway showerhead to prevent mixing of the precursors prior to entry into the chamber 302. In certain embodiments, cross-flow gas injection may be practiced by providing first and second cross-flow conduits 316 and 318 to the side entry 320. The apparatus 300 may contain either a showerhead configuration or a cross-flow injection configuration, or both.

The gas delivery system 310 and contact chamber 312 may deliver Group III precursors or Group V precursors, or both Group III and Group V precursors simultaneously or sequentially. Examples of precursors used to deposit III-V materials include tertiarybutylarsine (TBAs), tertiarybutylphosphine (TBP), arsine (AsH$_3$), phospine (PH$_3$), trimethylgallium (TMGa), triethylgallium (TEGa), trimethylaluminum (TMAl), trimethylindium (TMIn), and the like. In certain embodiments, carrier gases, such as nitrogen (N$_2$) and or hydrogen (H$_2$), may be flowed with the Group III or Group V precursors to the chamber 302. The gas delivery system 310 may also deliver deposition or selectivity control species to the chamber 302. The feed system 328 may include liquid or gaseous sources and controls (not shown), which may be configured in an enclosed cabinet.

The contact chamber 312 may be coupled to either the side entry point 320 or the showerhead 304 by a conduit 314 adapted to carry a liquid or solid precursor to the chamber 302. Conduits 314, 316, and 322 may be heated to a temperature between about 50° C. and about 200° C. to control or prevent condensation of the precursor being transferred therein. The contact chamber 312 may contain a liquid organometallic, a bed of solid metal, or metal halide crystals. The aforementioned materials may be sublimed into a carrier gas provided through one or both of gas feed conduits 362 and 364. In one embodiment, a halogen gas source may be provided through a first gas feed conduit 362 while a carrier gas may be provided through a second gas feed conduit 364. The gases, either for subliming or reacting, may be flowed through a liquid organometallic, powdered metal, or metal halide fluidized bed to enhance contacting. A mesh strainer or filter may be used to prevent entrainment of particles into the chamber 302. In another embodiment, the gases may flow across a fixed solid metal or metal halide bed.

An exhaust system 330 may be coupled to the chamber 302. The exhaust system 330 may be coupled to the chamber 302 at any convenient location, which may be dependent upon the location of the gas entry into the chamber 302. In embodiments where gas entry is provided through the showerhead 304, the exhaust system 330 may be coupled to a bottom wall of the chamber 302 around the heat source 306 by one or more portals or through an annular opening. In certain embodiments, an annular manifold (not shown) may be disposed near an edge of the substrate support 308 and may be coupled to the exhaust system 330. In embodiments utilizing cross-flow, the exhaust system 330 may be coupled to a sidewall of the chamber opposite the side entry 320.

An exhaust conduit 340 may couple an exhaust cap 332 to a vacuum pump 352 through a throttle valve 366. A jacket 368 may encompass the exhaust conduit 340 and throttle valve 366 from the exhaust cap 332 to an inlet 350 of the vacuum pump 352. The jacket 368 enables thermal control of the exhaust conduit 340 to prevent condensation of exhaust species. A heating medium, such as steam, hot air, water, or other hot fluid, may be used to maintain the exhaust conduit 340 at a temperature above a dew point of the exhaust gas. In certain embodiments, the jacket 368 may include resistive heating elements, for example, an electric blanket. A condensation trap 336 may be coupled to the exhaust conduit 340 by a valve 338, if desired, to further enhance trapping of any condensates in the exhaust system 330. The vacuum pump 352 may provide exhaust species to an abatement system 356 through an abatement conduit 354 and cleaned gas exhaust 358. To further reduce wetting or nucleation in the exhaust conduit 340, the exhaust conduit 340 may be coated with quartz or with an inert polymer material.

Plasma or ultraviolet activated cleaning agents may be coupled into the exhaust system 330 by an active source 334, which may be coupled to a microwave or RF chamber for generating cleaning species. A cleaning gas line 326 may provide cleaning gases from the gas delivery system 310 to the exhaust conduit 340, proceeding through the active source 334, if desired. Use of active species for cleaning may provide for cleaning to proceed at reduced temperatures.

A controller 370 may be provided and may be coupled to various components of the apparatus 300 to control the operation thereof. The controller 370 may include a central processing unit (CPU) 372, a memory 374, and support circuits 376. The controller 370 may control the apparatus 300 directly, or via computers (or controllers) associated with particular process chamber and/or support system components. The controller 370 may be one of any form of general purpose computer processors that can be used in an industrial setting for controlling various chambers and sub-processors. The memory 374, or computer readable medium, of the controller 370 may be one or more of readily available memory such as random access memory (RAM), read only memory (ROM), floppy disk, hard disk, optical storage media, flash drive, or any other form of digital storage, local or remote. The support circuits 376 may be coupled to the CPU 372 for supporting the processor in a conventional manner. The support circuits 376 may include, cache, power supplies, clock circuits, input/output circuitry and subsystems, and the like. Methods described herein may be stored in the memory 374 as a software routine that may be executed or invoked to control the operation of the process chamber 302 in the manner described herein. The software routine may also be stored and/or executed by a second CPU (not shown) that may be remotely located from the hardware being controlled by the CPU 372.

While the foregoing is directed to embodiments of the present disclosure, other and further embodiments of the disclosure may be devised without departing from the basic scope thereof, and the scope thereof is determined by the claims that follow.

The invention claimed is:

1. A method of forming a device structure on a substrate, comprising:
   depositing a first III-V buffer layer on a Group IV substrate, wherein the first III-V buffer layer has a thickness between about 10 nm and about 20 nm;
   depositing an AlAs buffer layer over the first III-V buffer layer; and
   depositing a III-V device layer over the AlAs buffer layer.

2. The method of claim 1, wherein the Group IV substrate is silicon.

3. The method of claim 1, wherein the first III-V buffer layer comprises GaAs.

4. The method of claim 3 wherein the III-V device layer comprises InAs or InGaAs.

5. The method of claim 1, wherein the AlAs buffer layer has a thickness between about 50 nm and about 800 nm.

6. The method of claim 5, wherein the III-V device layer has a thickness between about 5 nm and about 15 nm.

7. The method of claim 1, wherein the device structure is formed on a blanket Group IV substrate or a patterned Group IV substrate.

8. The method of claim 1, wherein the first III-V buffer layer, the AlAs buffer layer, and the III-V device layer are deposited by an MOCVD process, an MBE process, or an HVPE process.

9. A method of forming a device structure on a substrate, comprising:
   depositing a first III-V buffer layer on a Group IV substrate, wherein the first III-V buffer layer comprises a superlattice structure, and wherein the first III-V buffer layer has a thickness between about 10 nm and about 20 nm;
   depositing an AlAs buffer layer over the first III-V buffer layer; and
   depositing a III-V device layer over the AlAs buffer layer.

10. The method of claim 9, wherein the first III-V buffer layer comprises a superlattice structure comprising GaAs and AlAs.

11. The method of claim 9, wherein the first III-V buffer layer comprises a superlattice structure comprising GaAs and InGaAs.

12. The method of claim 9, wherein the first III-V buffer layer is a superlattice structure comprising GaAs and AlGaAs.

13. The method of claim 9, wherein the first III-V buffer layer is a superlattice structure comprising GaAs and InAlAs.

14. The method of claim 9, wherein the first III-V buffer layer is a superlattice structure comprising GaAs and InP.

15. The method of claim 9, wherein the AlAs buffer layer has a thickness between about 50 nm and about 800 nm.

16. The method of claim 9, wherein the Group IV substrate is silicon.

17. The method of claim 6, wherein the device structure is formed on a blanket Group IV substrate or a patterned Group IV substrate.

18. The method of claim 9, wherein the first III-V buffer layer, the AlAs buffer layer, and the III-V device layer are deposited by an MOCVD process, an MBE process, or an HVPE process.

19. A method of forming a device structure on a substrate, comprising:
   depositing a first III-V buffer layer comprising GaAs having a thickness between about 10 nm and about 20 nm on a Group IV substrate;
   depositing an AlAs buffer layer having a thickness between about 50 nm and about 800 nm over the first III-V buffer layer; and
   depositing a III-V device layer comprising InAs or InGaAs having a thickness between about 5 nm and about 15 nm over the AlAs buffer layer.

* * * * *